United States Patent
Liu et al.

(10) Patent No.: US 10,916,568 B2
(45) Date of Patent: Feb. 9, 2021

(54) MANUFACTURING METHOD OF DISPLAY SUBSTRATE, ARRAY SUBSTRATE AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Jun Liu, Beijing (CN); Ming Wang, Beijing (CN); Jun Wang, Beijing (CN); Bin Zhou, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 456 days.

(21) Appl. No.: 15/777,118

(22) PCT Filed: Sep. 26, 2017

(86) PCT No.: PCT/CN2017/103454
§ 371 (c)(1),
(2) Date: May 17, 2018

(87) PCT Pub. No.: WO2018/176766
PCT Pub. Date: Oct. 4, 2018

(65) Prior Publication Data
US 2020/0312881 A1    Oct. 1, 2020

(30) Foreign Application Priority Data
Mar. 30, 2017 (CN) .......................... 2017 1 0203759

(51) Int. Cl.
*H01L 27/12*      (2006.01)
*H01L 27/32*      (2006.01)

(52) U.S. Cl.
CPC .......... *H01L 27/124* (2013.01); *H01L 27/127* (2013.01); *H01L 27/1288* (2013.01);
(Continued)

(58) Field of Classification Search
CPC ..... H01L 27/12; H01L 27/124; H01L 27/127; H01L 27/1214; H01L 27/1233;
(Continued)

(56) References Cited

U.S. PATENT DOCUMENTS

2011/0221697 A1   9/2011   Okamoto et al.
2012/0320307 A1   12/2012   Aichi et al.
(Continued)

FOREIGN PATENT DOCUMENTS

| CN | 103887316 A | 6/2014 |
|---|---|---|
| CN | 104881196 A | 9/2015 |
| CN | 106373969 A | 2/2017 |

OTHER PUBLICATIONS

International Search Report and Written Opinion dated Jan. 4, 2018; PCT/CN2017/103454.

*Primary Examiner* — Chuong A Luu

(57) ABSTRACT

A manufacturing method of a display substrate, an array substrate and a display device are provided. The method includes forming a first wire, a first insulation layer, a first and second metal layer, and a photoresist layer; forming a photoresist retained pattern above the first wire; forming a second and first metal layer retained pattern under the photoresist retained pattern; forming a second insulation layer with a thickness less than or equal to a sum of thicknesses of the first and second metal layer; the second insulation layer forming a fracture region at a boundary (Continued)

between a part covering the first insulation layer and another part covering the second metal layer retained pattern; removing the first and second metal layer retained patterns by a wet etch process to expose the first insulation layer; and forming a contact hole exposing the first wire.

13 Claims, 5 Drawing Sheets

(52) U.S. Cl.
CPC ...... *H01L 27/1214* (2013.01); *H01L 27/1244* (2013.01); *H01L 27/1296* (2013.01); *H01L 27/3244* (2013.01); *H01L 27/3276* (2013.01); *H01L 27/3279* (2013.01)

(58) Field of Classification Search
CPC ............. H01L 27/1237; H01L 27/1244; H01L 27/1248; H01L 27/1259; H01L 27/3276; H01L 27/3288; H01L 21/32; H01L 21/768; H01L 21/76811; H01L 21/823475; H01L 23/522; H01L 23/53219; H01L 23/53223; H01L 23/5329; H01L 21/53295
USPC ......................................................... 438/128
See application file for complete search history.

(56) References Cited

U.S. PATENT DOCUMENTS

| | | | |
|---|---|---|---|
| 2017/0011994 A1* | 1/2017 | Noguchi | H01L 21/76813 |
| 2017/0147850 A1 | 5/2017 | Liu et al. | |
| 2017/0170282 A1* | 6/2017 | Zechmann | H01L 29/2003 |
| 2017/0317113 A1* | 11/2017 | Lv | H01L 27/124 |

* cited by examiner

MANUFACTURING METHOD OF DISPLAY SUBSTRATE, ARRAY SUBSTRATE AND DISPLAY DEVICE

TECHNICAL FIELD

The present disclosure relates to a manufacturing method, an array substrate and a display device.

BACKGROUND

Dry Etch is to etch a film by utilizing high-energy plasma to strike on a surface of the film, and it is widely used in the field of manufacturing semiconductors and flat panel displays.

The existing manufacturing method of display panel involves a process of forming a contact (abbreviated as CNT) hole in an insulation layer, which mainly includes forming a patterned photoresist layer on the insulation layer and etching a region of the insulation layer exposed by the photoresist, to form a via hole in a desired region. The targets to be etched are typically the oxide and/or the nitride (e.g., silicon oxide $SiO_x$ and/or silicon nitride $SiN_y$). When etching the region of the insulation layer exposed by the photoresist, because the thickness of the layer to be etched is relatively large (the thickness is generally above 400 nm), the required etching time is relatively long, resulting in photoresist burning due to a portion of retained photoresist being subjected to bombardment of the plasma for a long time in the dry etch. In the subsequent wet strip on the photoresist retained on the other regions of the insulation layer, there will be more residual particles that cannot be stripped off on the insulation layer. At the same time, it will also cause a series of advantages, such as the tact time prolongation of the dry etch equipment, and the shortening of the maintenance period required by the equipment chamber, etc.

SUMMARY

One embodiment of the disclosure provides a manufacturing method of a display substrate, comprising: forming a first wire, a first insulation layer, a first metal layer, a second metal layer, and a photoresist layer sequentially on, a base substrate; patterning the photoresist layer to form a photoresist retained pattern above the first wire; etching the second metal layer and the first metal layer exposed by the photoresist retained pattern, to form a second metal layer retained pattern and a first metal layer retained pattern under the photoresist retained pattern, wherein an etching rate of the first metal layer is greater than an etching rate of the second metal layer in a same etch process; removing the photoresist retained pattern; forming a second insulation layer above the base substrate, wherein a thickness of the second insulation layer is less than or equal to a sum of a thicknesses of the first metal layer and a thickness of the second metal layer, so that the second insulation layer forms a fracture region at a boundary between a part of the second insulation layer covering the first insulation layer and another part of the second insulation layer covering the second metal layer retained pattern; removing the first metal layer retained pattern and the second metal layer retained pattern by a wet etch process to expose the first insulation layer; and removing an exposed region of the first insulation layer, to form a contact hole exposing the first wire.

In some examples, a thickness of the first insulation layer is 100 to 150 nm.

In some examples, a wet etch process is used in etching the second metal layer and the first metal layer exposed by the photoresist retained pattern.

In some examples, the first metal layer has a material of elemental molybdenum, the second metal layer has a material of elemental aluminum, and an etch liquid for the wet etch process comprises at least one selected from the group consisted of nitric acid, phosphoric acid, hydrochloric acid and acetic acid.

In some examples, forming the first wire on the base substrate further comprises: forming a gate electrode and a gate line disposed in a same layer as the first wire.

In some examples, the second insulation layer comprises a gate insulation layer.

In some examples, the second insulation layer further comprises an etch stop layer formed on the gate insulation layer, and the method further comprises forming an active layer pattern above the gate electrode between forming the gate insulation layer and forming the etch stop layer.

In some examples, the manufacturing method further comprises: patterning the etch stop layer to form a first via hole and a second via hole exposing the active layer under the etch stop layer.

In some examples, the manufacturing method further comprises: forming a second wire above the base substrate, wherein the second wire is electrically connected to the first wire through the contact hole.

In some examples, forming the second wire above the base substrate further comprises forming a source electrode, a drain electrode, and a data line connected to the source electrode disposed in a same layer as the second wire, wherein the source electrode and the drain electrode are respectively electrically connected to the active layer through the first via hole and the second via hole.

In some examples, the first metal layer has a thickness of 100-150 nm; the second metal layer has a thickness of 100-150 nm; and the second insulation layer has a thickness of 200-300 nm.

In some examples, the first insulation layer has a material of at least one of silicon nitride or silicon oxide.

Another embodiment of the disclosure provides an array substrate, manufactured by the manufacturing method as mentioned above.

Another embodiment of the disclosure provides a display device, comprising the array substrate as mentioned above.

According to the embodiments of the disclosure, the process of forming the contact hole is optimized, to solve problems in the conventional contact hole etching process, such as photoresist burning and particle residue of the burned product of the photoresist, the etch device chamber process time prolongation, and the maintenance period shortening.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
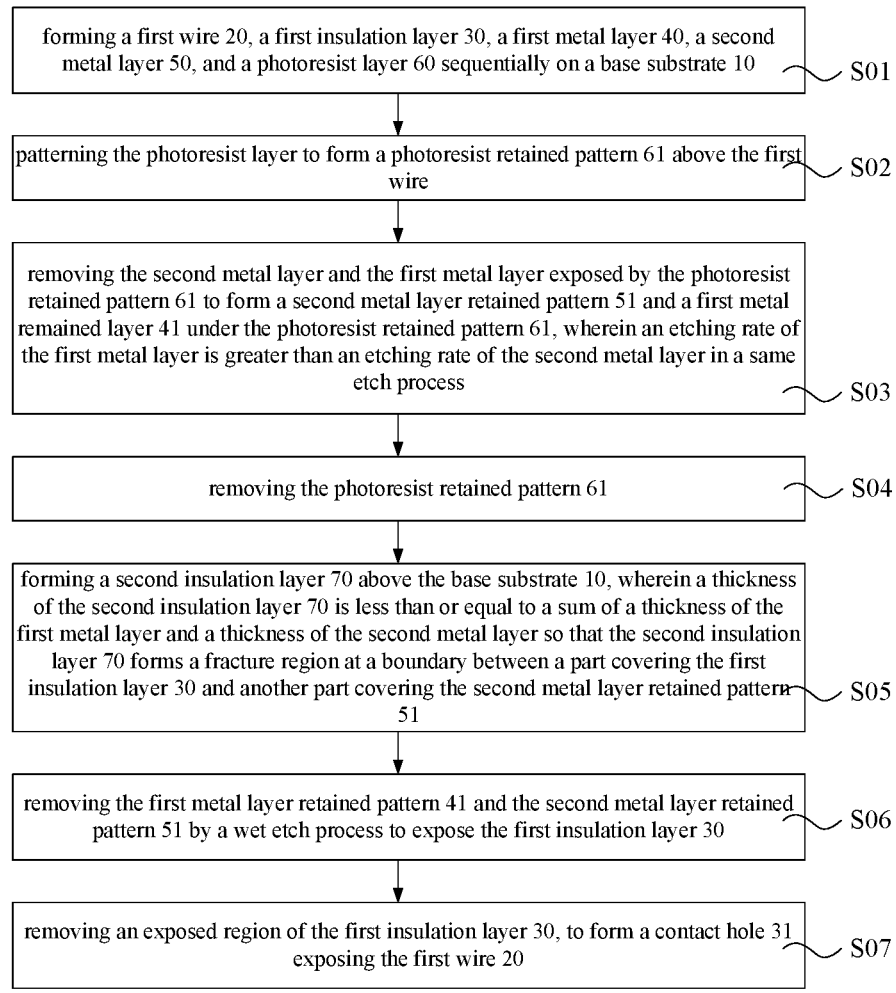
FIG. 1 is a flow diagram of a manufacturing method of a display substrate provided by an embodiment of the disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Because the structural parameters of the display substrate according to the embodiments of the present invention, such as the size of the via hole and the thickness of the film layer, are small, for the sake of clarity, the dimensions of each structure in the drawings of the embodiments of the present invention are exaggerated, and do not represent actual dimensions and proportions.

As illustrated in FIG. 1, an embodiment of the present disclosure provides a manufacturing method of a display substrate 01, and the manufacturing method comprises following steps S01-S07.

Figure 2:
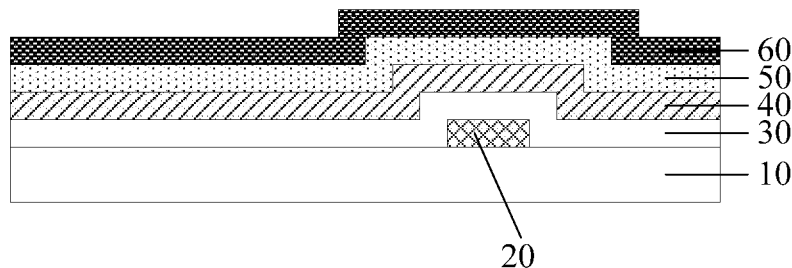
FIGS. 2-7 are schematic diagrams of respective steps of the manufacturing method of FIG. 1.

Step S01, as illustrated in FIG. 2, forming a first wire 20, a first insulation layer 30, a first metal layer 40, a second metal layer 50, and a photoresist layer 60 sequentially on a base substrate 10.

Figure 3:
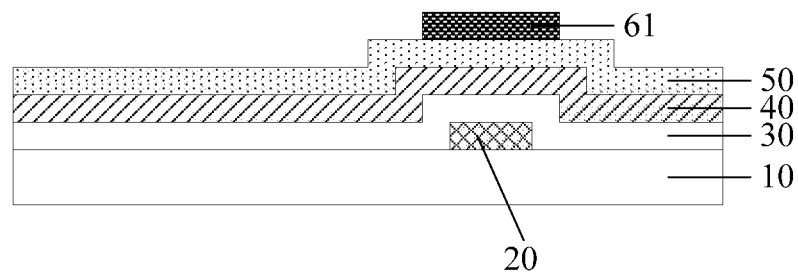

Step S02, as illustrated in FIG. 3, patterning the photoresist layer to form a photoresist retained pattern 61 above the first wire.

Figure 4:
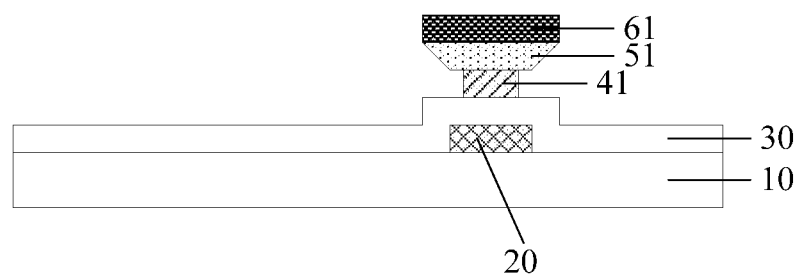

Step S03, as illustrated in FIG. 4, removing the second metal layer and the first metal layer exposed by the photoresist retained pattern 61 to form a second metal layer retained pattern 51 and a first metal layer retained pattern 41 under the photoresist retained pattern 61, wherein an etching rate of the first metal layer is greater than an etching rate of the second metal layer in a same etch process.

Step S04, removing the photoresist retained pattern 61.

Figure 5:
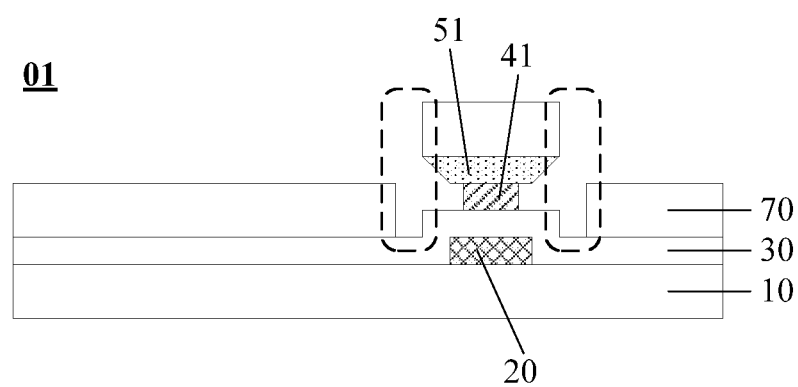

Step S05, as illustrated in FIG. 5, forming a second insulation layer 70 above the base substrate 10; wherein a thickness of the second insulation layer 70 is less than or equal to a sum of a thickness of the first metal layer and a thickness of the second metal layer so that the second insulation layer 70 forms a fracture region at a boundary between a part covering the first insulation layer 30 and a part covering the second metal layer retained pattern 51 (illustrated in the figure by a dashed frame).

Figure 6:
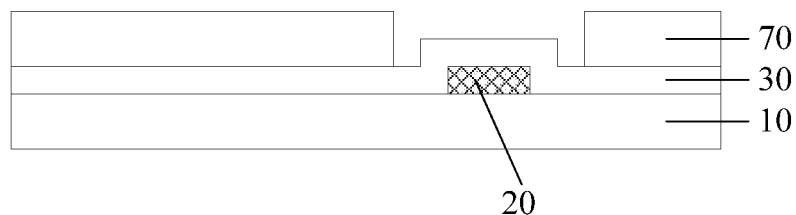

Step 06, as illustrated in FIG. 6, removing the first metal layer retained pattern 41 and the second metal layer retained pattern 51 by a wet etch process to expose the first insulation layer 30.

Figure 7:
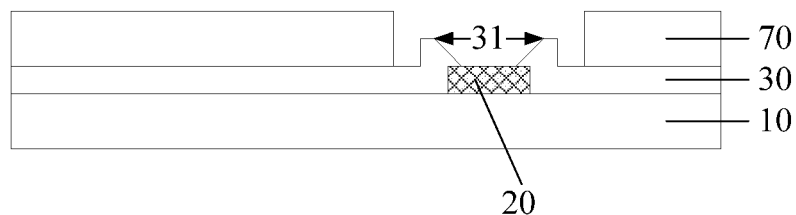

Step 07, as illustrated in FIG. 7, removing an exposed region of the first insulation layer 30, to form a contact hole 31 exposing the first wire 20.

It should be noted that, in the above mentioned step S01, the first wire 20, the first insulation layer 30, the first metal layer 40, the second metal layer 50, and the photoresist layer 60 are sequentially formed on the base substrate 10, that is, the first insulation layer 30 covers surfaces of the first wire 20 and the base substrate 10, and the first metal layer 40, the second metal layer 50, and the photoresist layer 60 sequentially cover the previously formed film layer.

The first wire 20 is generally made of metal and alloy material. The above mentioned first wire 20 can be, for example, wires on the array substrate, such as a common electrode line etc. A number of wires and the wiring manner can be designed flexibly according to requirements of the display device to which the display substrate 01 is specifically applied, and the specific number of wires and the wiring manner on the base substrate 10 are not limited by the embodiment of the disclosure.

In the above mentioned step S02, patterning the photoresist layer 60 refers to perform an ultraviolet exposing process on the photoresist layer 60 by a mask, and developing the exposed photoresist layer 60 to remove a portion of the photoresist layer 60 and remain another portion of the photoresist layer 60, so as to form a photoresist retained pattern 61.

The above mentioned photoresist layer 60 provided by the embodiment of the present disclosure can be positive photoresist, and the positive photoresist has characteristics of not being dissolved in the developer before exposure and being converted into being dissolved in the developer after exposure; or the photoresist layer 60 can also be negative photoresist, and the negative photoresist has characteristics of being dissolved in the developer before exposure and being converted into not being dissolved in the developer after exposure. A mask can be selected corresponding to the exposure characteristics of the positive photoresist or the negative photoresist. For specific principles, reference can be made to the prior art, and this will not be repeated by the embodiment of the present disclosure.

In the above mentioned step S03, removing the second metal layer 50 and the first metal layer 40 under the second metal layer 50 exposed by the photoresist retained pattern 61 to form the second metal layer retained pattern 51 and the first metal layer retained pattern 41 under the photoresist retained pattern 61, refers to etching the second metal layer 50 and the first metal layer 40 under the second metal layer 40 by using the wet or dry etch process to form a corresponding retained pattern.

Here, because the etching rate of the first metal layer 40 is greater than the etching rate of the second metal layer 50 in the same etch process, i.e., in the same wet or dry etch process, the first metal layer 40 located in the lower layer is etched faster, that is, in the same etch process, the area of the retained first metal layer 40 in the lower layer will be smaller, and thus after the etching is completed, at a position corresponding to the contact hole to be formed, an inverted-taper structure in which the second metal layer retained pattern 51 and the first metal layer retained pattern 41 are superposed is formed.

In the above mentioned step S04, the photoresist retained pattern 61 can be removed by an ash process, i.e., the photoresist is removed as a target to be etched by an etch process.

In the above mentioned step S05, because the second metal layer retained pattern 51 and the first metal layer retained pattern 41 are superimposed to form the inverted-taper shape, the inverted-taper structure is more protrusive than the first insulation layer 30; and the thickness of the second insulation layer 70 formed later is less than or equal to the sum of the thickness of the first metal layer and the thickness of the second metal layer, thus the second insulation layer 70 cannot uniformly cover step edges of the second metal layer retained pattern 51 during the process of forming the film, i.e., the thin film of the second insulation layer 70 cannot be continuously deposited at the edge of the inverted-taper structure, so as to form the fracture region at the boundary between a part covering the first insulation layer 30 and a part covering the second metal layer retained pattern 51, as illustrated in the dashed frame of FIG. 5.

In the above mentioned step S06, in order to ensure that only the inverted-taper structure and a portion of the unconnected isolated second insulation layer 70 above the inverted-taper structure are removed without removing the continuous other region of the second insulation layer 70, the wet etch process can be adopted to etch the inverted-taper structure of the metal, wherein the etching rates of the etching solution adopted in the wet etch process for the metal and the insulation layer (usually composed of oxides) are different greatly, and therefore only the metal part is etched. Because the inverted-taper structure of the underlying metal is etched and removed, the isolated insulation layer above the inverted-taper structure of the underlying metal is also removed since it is not supported by the underlying pattern layer, thereby exposing the first insulation layer 30 under the metal inverted-taper structure.

In the above mentioned step S07, because the first insulation layer 30 is only exposed in the region corresponding to the first wire 20 and the other regions are still covered by the second insulation layer 70, the exposed region of the first insulation layer 30 can be directly etched by the wet or dry etch process, to form the contact hole 31 of the first wire 20 exposing the first wire 31, without forming the photoresist on the exposed first insulation layer 30. Thus, the disadvantages, such as the PR Burning, the residual particles, the tact time prolongation of the etch equipment, and the maintenance period shortening of the equipment chamber etc., are avoided.

After the above mentioned steps S01 to S07, a second wire can be formed on the display substrate 01 to contact with the first wire 20 through the contact hole 31 to achieve electrical connection.

Based on this, by the manufacturing method of the above mentioned display substrate 01 provided by the embodiment of the present disclosure, the first metal layer 40 and the second metal layer 50 with different etching rates are used to form an inverted-taper metal retained pattern superimposed structure on the region of the contact hole 31 to be formed in the first insulation layer 30. Moreover, because the thickness of the second insulation layer 70 formed later is less than or equal to the sum of the thicknesses of the two metal layers, the second insulation layer 70 cannot uniformly cover the step edge of the inverted-taper structure during the process of forming the film, and therefore an additional patterning process is not necessary for forming the fracture region at the boundary between a part of the second insulation layer 70 covering the first insulation layer 30 and a part of the second insulation layer 70 covering the second metal layer retained pattern 51, i.e., an isolated portion of the second insulation layer 70 is formed on the inverted-taper structure. The metal inverted-taper structure is subsequently removed by a wet etch process and the portion of the isolated second insulation layer 70 retained above it can be removed at the same time, thereby exposing the region of the contact hole 31 to be formed in the first insulation layer 30. Because only the region of the contact hole 31 is exposed, this region can be directly etched to form the contact hole 31 exposing the first wire 20, without the additional photoresist pattern patterning as in the prior art. Because the process of forming the above-mentioned contact hole 31 in the first insulation layer 30 does not involve the process of patterning with the photoresist, a series of disadvantages related to the process of patterning with the photoresist in the prior art, such as photoresist burning, particles residue of the burning product of the photoresist, and etch process interruption caused by by-product accumulation in a deep hole, the tact time prolongation of the etch device chamber, and shortening of the maintenance period shortening etc., are avoided, thereby optimizing the process of forming the contact hole and improving the process efficiency.

Based on the above, the material of the first insulation layer 30 can be silicon nitride and/or silicon oxide, and for example, the thickness of the first insulation layer 30 can be 100 to 150 nm. Due to the small thickness, the time for etching the first insulation layer 30 to form the contact hole 31 can be significantly shortened, thereby further shortening the tact time of the etch equipment chamber, prolonging the equipment maintenance period, and increasing the utilization rate of the equipment.

Further, in the above step S01, the two formed metal layers with different etching rates can be exemplified by that the material of the first metal layer 40 is elemental molybdenum with a thickness of 100 to 150 nm; and the material of the second metal layer 50 is elemental aluminum with a thickness of 100~150 nm.

Correspondingly, in the following step S03, the process of etching the first metal layer 40 of the elemental molybdenum and the second metal layer 50 of the elemental aluminum is specifically the wet etch, and the etch liquid of the wet etch comprises nitric acid, phosphoric acid, hydrochloric acid and acetic acid.

In addition, because, in the above mentioned step S05, the thickness of the formed second insulation layer 70 is required to be less than or equal to the sum of the thickness of the first metal layer and the thickness of the second metal layer in order to form the aforementioned fracture region, the thickness of the second insulation layer 70 can be 200 to 300 nm.

Based on the above, the above mentioned display substrate 01 can be, for example, an array substrate.

For example, the above mentioned step S01 further comprises forming a gate electrode and a gate line disposed in a same layer as the first wire 20.

Here, the above mentioned "disposed in a same layer" refers to at least two patterns, that is, at least two patterns (for example, the above first wire 20 as well as the gate electrode and the gate line) are disposed on the same substrate (for example, the above base substrate 10). For example, a film made of the same material is processed by a patterning process (Mask) to form the above mentioned at least two patterns. The patterning process is a process of processing a film (consisting of one or more thin films) to form a specific pattern. A typical patterning process is a process of exposing, developing, etching, and removing by applying a mask. The mask can be a normal mask, a half tone mask, or a grey tone mask, which can be flexibly adjusted according to a specific patterning process.

For example, the second insulation layer 70 formed in step S05 is a gate insulation layer. A gate insulation layer is formed on the base substrate; an active layer is formed in a region where the gate insulation layer covers the gate electrode; and an etch stop layer is formed on the gate insulation layer and the active layer; wherein both of the gate insulation layer and the etch stop layer have fracture regions at the boundary between a part covering the first insulation layer and a part covering the second metal retained pattern.

That is, the metal retained pattern with the inverted-taper structure has an isolated gate insulation layer portion and etch stop layer portion that are not continuous with the peripheral film layer.

Because the etch stop layer covers the active layer in step S05, when the above mentioned display substrate is specifically an array substrate, the above mentioned manufacturing method further comprises patterning the etch stop layer to form a first via hole and a second via hole exposing the active layer under the etch stop layer.

Further, the above mentioned manufacturing method further comprises: forming a second wire on the base substrate; wherein the second wire is electrically connected to the first wire 20 through the contact hole 31.

For example, the step of forming the second wire on the base substrate further comprises forming a source electrode, a drain electrode, and a data line connected to the source electrode disposed in the same layer as the second wire, i.e., forming respective thin film transistors arranged on the array substrate.

For example, the source electrode and the drain electrode are respectively electrically connected to the active layer through the first via hole and the second via hole formed as described above.

A specific example is provided below to describe the above mentioned manufacturing method in detail.

Figure 8:
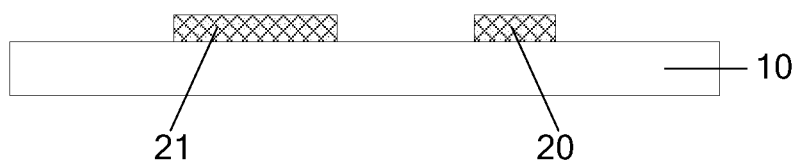
FIGS. 8-14 are structural schematic diagrams of respective steps of a manufacturing method of an array substrate provided by an embodiment of the disclosure.

Step S11, as illustrated in FIG. 8, a metal layer is deposited on the base substrate 10 (for example, a glass substrate) as a gate metal layer, and the material of the metal layer can be Al, Mo, Cu, or a combination thereof, and a thickness of the metal layer can be 400 to 700 nm; a gate metal pattern layer including the first wire 20, the gate electrode 21, and the gate line is formed by a patterning process (including masking and etching step).

Figure 9:
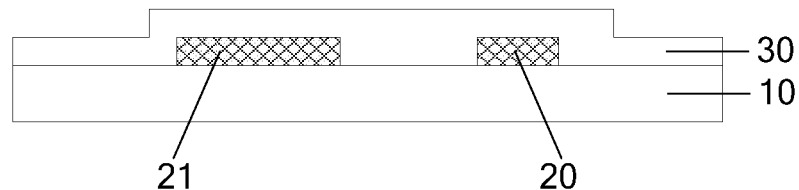

Step S12, as illustrated in FIG. 9, a first insulation layer 30 is deposited on the formed gate metal pattern layer as a first gate insulation layer, and the material of the first insulation layer 30 can be SiN or SiO, and the thickness of the first insulation layer 30 is 100 to 150 nm.

Figure 10:
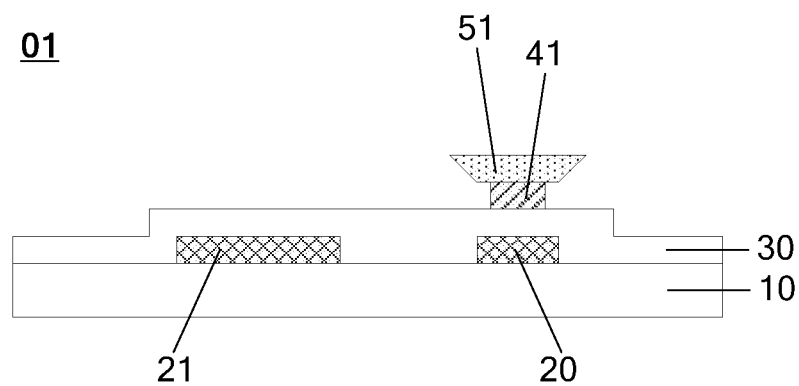

Step S13, as illustrated in FIG. 10, two metal layers which are respectively a first metal layer and a second metal layer are sequentially deposited on the formed first gate insulation layer; the metal layer is wet etched or dry etched by the mask for forming a contact hole (CNT MASK), to form an inverted-taper structure including the first metal layer retained pattern 41 and the second metal layer retained pattern 51.

In order to ensure that the subsequently deposited gate insulation layer has a fracture layer, the total thickness of the upper and lower metal layers is larger than the thickness of the subsequently formed gate insulation layer (GI), a thickness of the lower metal layer can be 100 to 150 nm, a thickness of the upper metal layer can be 100 to 150 nm, and the etching rate of the lower metal layer is faster than the etching rate of the upper metal layer. For example, for a mixed acidic etch solution including nitric acid/phosphoric acid/hydrochloric acid/acetic acid, the lower metal layer can be elemental Mo with a thickness of 150 nm, and the upper metal layer can be elemental Al with a thickness of 150 nm. Because the etching rate of Mo in the above mentioned mixed acid is faster than that of Al, an inverted-taper shape illustrated in the figure is formed at the position of the contact hole to be formed after the etching is completed.

Figure 11:
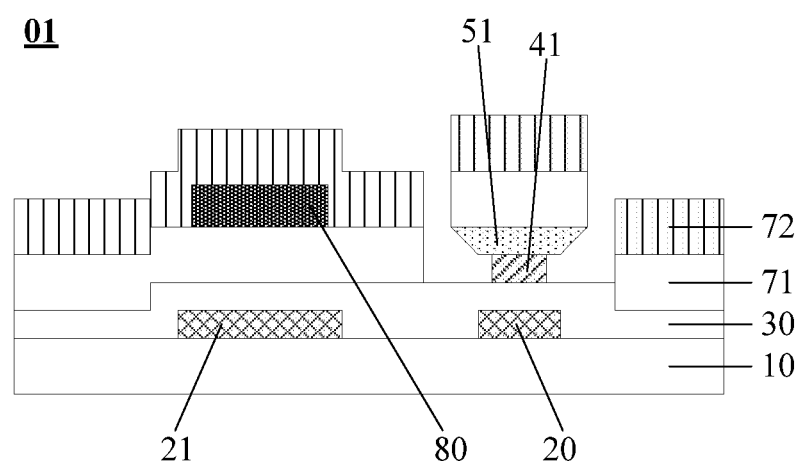

Step S14, as illustrated in FIG. 11, a second gate insulation layer (GI) 71 is deposited and a pattern of an oxide active layer 80 is formed by patterning (comprising masking and etching) the active layer on the region where the second gate insulation layer 71 covers the gate electrode 21; wherein the material of the GI can be SiO; the material of the oxide active layer can be indium gallium zinc oxide (IGZO) with a thickness of 50 nm. Because the pattern of the above mentioned metal retained at the contact hole to be formed is an inverted-taper shape, the GI cannot be continuously deposited at edges and is thus broken at the edge of the above mentioned inverted-taper metal pattern, and an isolated GI portion remains on the metal at the contact hole to be formed; after that, an etch stop layer (ESL) 72 is deposited as the protective layer of the oxide active layer. Because the metal retained pattern at the contact hole is in an inverted-taper shape, the ESL layer still cannot be continuously deposited at the edge and thus is broken at the edge of the inverted-taper shape metal retained pattern, and the isolated ESL layer portion is added onto the metal retained pattern at the contact hole to be formed.

For example, due to the presence of the second gate insulation layer 71 and the etch stop layer 72 in the first and second metal retained regions, in order to form the edge fracture, the total thickness of the second gate insulation layer 71 and the etch stop layer 72 is required to be less than or equal to the total thickness of the first and second metal layers. At this time, the second gate insulation layer 71 and the etch stop layer 72 can be regarded as the second insulation layer 70.

Here, due to the structure characteristics of the inverted-taper metal pattern and the size relationship between the thickness of the GI layer and the thickness of the metal layer, the GI layer cannot be continuously deposited at the edges, so before the oxide active layer 80 having a certain pattern is formed, the oxide which is deposited with an entire layer after the GI layer is formed, apparently cannot be continuously deposited at the edges of the inverted-taper metal pattern. Because the oxide is processed by a corresponding patterning process to obtain a pattern of the oxide active layer 80, during forming the pattern of the above mentioned oxide active layer 80, the isolated oxide portion can or cannot be retained on the inverted-taper metal retained pattern, and the figure only shows the case that the isolated oxide portion is not be retained on the inverted-taper metal retained pattern.

Figure 12:
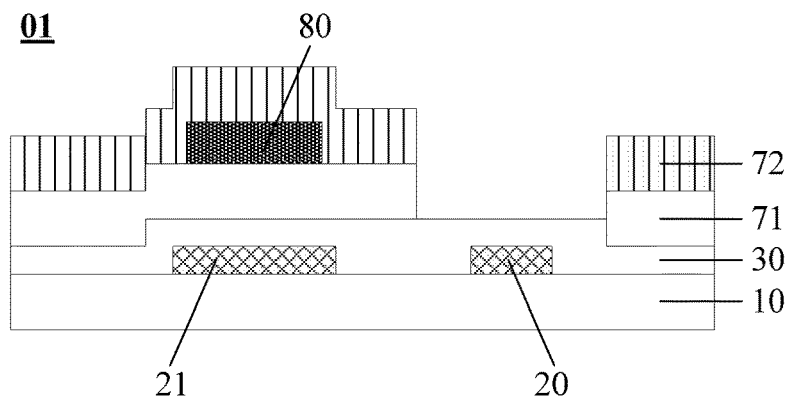

Step S15, as illustrated in FIG. 12, a wet etch process is used to remove the inverted-taper metal pattern at the contact hole, and the portion of the isolated second gate insulation layer (GI) 71 and the portion of the isolated etch stop layer 72 (ESL) retained on the inverted-taper metal pattern.

Figure 13:
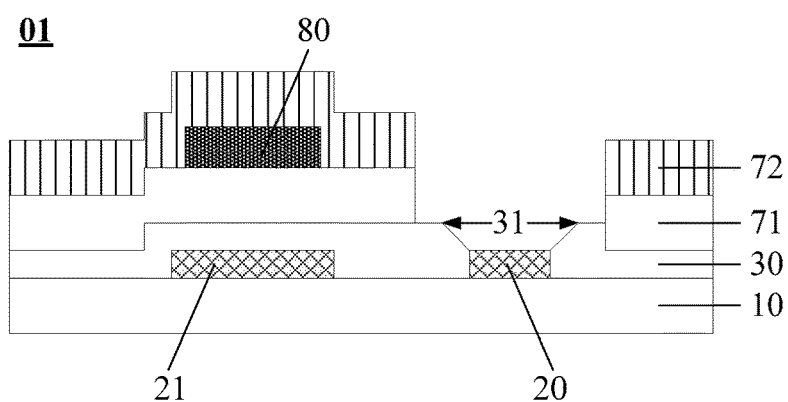

Step S16, as illustrated in FIG. 13, a complete contact hole 31 (CNT hole) can be obtained by performing dry etch without masking on the exposed first insulation layer 30 corresponding to the CNT hole to be formed. Because the thickness of the first gate insulation layer is relatively thin, the dry etch time required in the above mentioned step S16 is much shorter than the time required for forming the CNT hole in the conventional process, which can avoid the series of disadvantages, such as PR Burning caused by etching the conventional oxide contact hole, more residual particles that cannot be peeled off from the substrate after performing CNT Wet Strip on the photoresist involved in forming the contact hole, and the etch process interruption caused by by-product accumulation in a deep hole resulting from, for example, etching the deep hole for a long time, etc. Because the dry etch time is reduced, the tact time of the dry etch equipment can also be reduced, the equipment utilization rate can be increased, and the equipment chamber maintenance period can be shortened.

Figure 14:
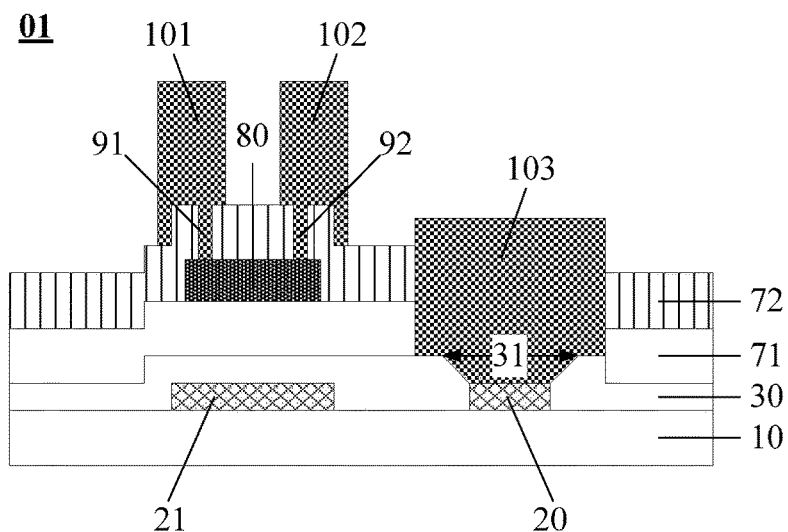

Step S17, as illustrated in FIG. 14, a patterning process (comprising ESL Mask, ESL Etch, and ESL Strip) is performed on the etch stop layer 72 to form the first via hole 91 and the second via hole 92 exposing the oxide active layer 80 under them. After that, a source/drain metal layer (i.e., SD layer) is deposited, and the material of the source/drain metal layer can be metal such as Mo, Al, Cu, etc. and a combination thereof, the thickness of the source/drain metal layer can be 300 to 500 nm, and a patterning process is performed on the source/drain metal layer to obtain the source electrode 101, the drain electrode 102, the data line connected to the source 101 and the second wire 103.

The source electrode 101 and the drain electrode 102 are respectively in contact with the oxide active layer 80 through the previously formed first via hole 91 and the second via hole 92. The second wire 103 is in contact with the first wire through the previously formed contact 31.

Based on the above, embodiments of the present disclosure further provides a display device, comprising the above mentioned array substrate. The display device can be any product or component having display function, such as a liquid crystal display device, a liquid crystal display, a liquid crystal television, an organic electroluminescent display device, an organic electroluminescent display, an organic electroluminescent television, a digital photo frame, a mobile phone, a tablet computer, a navigator, or the like.

What are described above is related to the exemplified embodiments of the disclosure only and not limitative to the scope of the disclosure; the scopes of the disclosure are defined by the accompanying claims.

This application claims the priority of Chinese Patent Application No. 201710203759.3 filed on Mar. 30, 2017, which is hereby incorporated entirely herein by reference.

The invention claimed is:

1. A manufacturing method of a display substrate, comprising:
    forming a first wire, a first insulation layer, a first metal layer, a second metal layer, and a photoresist layer sequentially on a base substrate;
    patterning the photoresist layer to form a photoresist retained pattern above the first wire;
    etching the second metal layer and the first metal layer exposed by the photoresist retained pattern, to form a second metal layer retained pattern and a first metal layer retained pattern under the photoresist retained pattern, wherein an etching rate of the first metal layer is greater than an etching rate of the second metal layer in a same etch process;
    removing the photoresist retained pattern;
    forming a second insulation layer above the base substrate, wherein a thickness of the second insulation layer is less than or equal to a sum of a thicknesses of the first metal layer and a thickness of the second metal layer, so that the second insulation layer forms a fracture region at a boundary between a part of the second insulation layer covering the first insulation layer and another part of the second insulation layer covering the second metal layer retained pattern;
    removing the first metal layer retained pattern and the second metal layer retained pattern by a wet etch process to expose the first insulation layer; and
    removing an exposed region of the first insulation layer, to form a contact hole exposing the first wire.

2. The manufacturing method of claim 1, wherein a thickness of the first insulation layer is 100 to 150 nm.

3. The manufacturing method of claim 1, wherein a wet etch process is used in etching the second metal layer and the first metal layer exposed by the photoresist retained pattern.

4. The manufacturing method of claim 3, wherein the first metal layer has a material of elemental molybdenum, the second metal layer has a material of elemental aluminum, and an etch liquid for the wet etch process comprises at least one selected from the group consisted of nitric acid, phosphoric acid, hydrochloric acid and acetic acid.

5. The manufacturing method of claim 1, further comprising: simultaneously with forming the first wire on the base substrate, forming a gate electrode and a gate line disposed in a same layer as the first wire.

6. The manufacturing method of claim 5, wherein the second insulation layer comprises a gate insulation layer.

7. The manufacturing method of claim 6, wherein the second insulation layer further comprises an etch stop layer formed on the gate insulation layer, and the method further comprises forming an active layer pattern above the gate electrode between forming the gate insulation layer and forming the etch stop layer.

8. The manufacturing method of claim 7, further comprising: patterning the etch stop layer to form a first via hole and a second via hole exposing the active layer under the etch stop layer.

9. The manufacturing method of claim 8, further comprising, forming a second wire above the base substrate, wherein the second wire is electrically connected to the first wire through the contact hole.

10. The manufacturing method of claim 9, further comprising: simultaneously with forming the second wire above the base substrate, forming a source electrode, a drain electrode, and a data line connected to the source electrode disposed in a same layer as the second wire, wherein the source electrode and the drain electrode are respectively electrically connected to the active layer through the first via hole and the second via hole.

11. The manufacturing method of claim 1, wherein the first metal layer has a thickness of 100-150 nm; the second metal layer has a thickness of 100-150 nm; and the second insulation layer has a thickness of 200-300 nm.

12. The manufacturing method of claim 1, wherein the first insulation layer has a material of at least one of silicon nitride or silicon oxide.

13. The manufacturing method of claim 1, wherein an orthogonal projection of the first metal layer retained pattern has a smaller area than an orthogonal projection of the second metal layer retained pattern.

* * * * *